(12) United States Patent
Shiu et al.

(10) Patent No.: US 9,070,652 B2
(45) Date of Patent: Jun. 30, 2015

(54) TEST STRUCTURE FOR SEMICONDUCTOR PROCESS AND METHOD FOR MONITORING SEMICONDUCTOR PROCESS

(75) Inventors: Jian-Bin Shiu, Hsinchu County (TW); Tung-Sheng Lee, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 125 days.

(21) Appl. No.: 13/445,934

(22) Filed: Apr. 13, 2012

(65) Prior Publication Data
US 2013/0270557 A1    Oct. 17, 2013

(51) Int. Cl.
*H01L 21/66* (2006.01)

(52) U.S. Cl.
CPC .................................. *H01L 22/34* (2013.01)

(58) Field of Classification Search
USPC ................................................ 257/48; 438/18
See application file for complete search history.

(56) References Cited

U.S. PATENT DOCUMENTS

| | | | | |
|---|---|---|---|---|
| 5,290,727 A * | 3/1994 | Jain et al. | .................. | 438/238 |
| 5,471,422 A * | 11/1995 | Chang et al. | .................. | 365/185.26 |
| 5,474,947 A * | 12/1995 | Chang et al. | .................. | 438/257 |
| 5,650,651 A * | 7/1997 | Bui | .................. | 257/355 |
| 5,781,445 A * | 7/1998 | Shiue et al. | .................. | 702/57 |
| 6,028,324 A * | 2/2000 | Su et al. | .................. | 257/48 |
| 6,091,249 A * | 7/2000 | Talbot et al. | .................. | 324/754.22 |
| 6,235,642 B1 * | 5/2001 | Lee et al. | .................. | 438/710 |
| 6,452,412 B1 * | 9/2002 | Jarvis et al. | .................. | 438/18 |
| 6,586,765 B2 * | 7/2003 | Lin et al. | .................. | 257/48 |
| 6,958,249 B1 * | 10/2005 | Tzeng et al. | .................. | 438/18 |
| 7,501,837 B2 * | 3/2009 | Kuo et al. | .................. | 324/762.01 |
| 8,241,928 B2 * | 8/2012 | Lee et al. | .................. | 438/18 |
| 2003/0089948 A1 * | 5/2003 | Min | .................. | 257/347 |
| 2003/0197175 A1 * | 10/2003 | Huang et al. | .................. | 257/48 |
| 2004/0084712 A1 * | 5/2004 | Lin et al. | .................. | 257/314 |
| 2005/0184742 A1 | 8/2005 | Huang | | |
| 2008/0023699 A1 | 1/2008 | Lee | | |
| 2008/0224134 A1 * | 9/2008 | Bae et al. | .................. | 257/48 |
| 2009/0032813 A1 * | 2/2009 | Park et al. | .................. | 257/48 |
| 2012/0001646 A1 * | 1/2012 | Bolander et al. | .................. | 324/679 |
| 2013/0221353 A1 * | 8/2013 | Yang et al. | .................. | 257/48 |

OTHER PUBLICATIONS

Cismaru et al., "Relationship between the charging damage of test structures and the deposited charge on unpatterned wafers exposed to an electron cyclotron resonance plasma", Applied Physics Letters, vol. 72, No. 10, Mar. 9, 1998, 1143-1145.*

(Continued)

*Primary Examiner* — Jarrett Stark
*Assistant Examiner* — Charles N Ausar-el
(74) *Attorney, Agent, or Firm* — Winston Hsu; Scott Margo

(57) ABSTRACT

A monitoring method of a semiconductor process includes the following steps. A semiconductor substrate is provided, and a test structure is formed thereon. The method of forming the test structure includes the following steps. A first doped region and a second doped region are formed in the semiconductor substrate, and an insulating layer is formed on the semiconductor substrate. Subsequently, a conductive layer is directly formed on the insulating layer to complete the formation of the test structure, in which the conductive layer in a floating state partially overlaps the first doped region and partially overlaps the second doped region. Then, a voltage signal is applied to the test structure and the breakdown voltage (Vbd) between the first doped region and the second doped region is measured.

17 Claims, 7 Drawing Sheets

(56) References Cited

OTHER PUBLICATIONS

Kobayashi, Influence of Etch Process Sequence on CHARM-2 Wafer in Magnetically Enhanced RIE Etcher, May 2001.

Daryanani, Comparison of Implant Charging Results Obtained with QUANTOX and CHARM-2, Jun. 1998.

Lassig, Effects of Processing Pressure on Device Damage in RF Biased ECR CVD, 1999.

S. Q. Gu, Impact of F Species on Plasma Charge Damage in a RF asher, Jun. 2002.

Siu, Utility of CHARM -2 in Diagnosing Sources of Plasma Charging Damage in High Density Etchers and in Assisting Hardware Development, Jun. 2002.

Current, Photoresist Effects on Wafer Charging Control: Current-Voltage Characteristics Measured With Charm-2 Monitors During High-Current As+ Implantation, Jun. 1998.

Lukaszek, Device Effects and Charging Damage: Correlations Between SPIDER-MEM and CHARM-2, May 1999.

Lukaszek, Influence of Scribe Lane Structures on Wafer Potentials and Charging Damage, 2000.

Carrere, Electron-Shading Characterization in a HDP Contact Etching Process Using a Patterned CHARM Wafer, 2000.

* cited by examiner

TEST STRUCTURE FOR SEMICONDUCTOR PROCESS AND METHOD FOR MONITORING SEMICONDUCTOR PROCESS

BACKGROUND OF THE INVENTION

1. Field of the Invention

The present invention relates to a test structure for a semiconductor process and a method for monitoring said semiconductor process, and more particularly, to a test structure and a monitoring method for detecting the charged particles on the surface of a semiconductor substrate.

2. Description of the Prior Art

Manufacturing a semiconductor involves many sub-semiconductor processes such as the process for depositing the material layer, the process for defining patterns on the material layer, etc. In the chemical vapor deposition (CVD) process, the semiconductor substrate is exposed to a precursor or a plurality of precursors, and a chemical reaction occurs on the surface of the semiconductor substrate enabling the depositing of the material layer. The material layer includes an insulating layer made of silicon oxide or high-K (high dielectric constant) materials, or a conductive layer made of polysilicon, metal or alloy. A plasma enhanced chemical vapor deposition (PECVD) process takes advantage of plasma to accelerate the chemical reaction rate, which is applicable under low temperature conditions; consequently, the PECVD process is commonly implemented in the semiconductor process. Moreover, with the miniaturization of integrated circuits (IC), in addition to a lithography process, an anisotropic etching process is also significant for defining the patterns, for example, reactive-ion-etching (RIE) plasmas are used extensively in the etching process to achieve a high degree of pattern definition and precise dimensional control.

During the plasma process, such as the PECVD process detailed above, the surface of the semiconductor substrate is bombarded by plasma ions, and charged particles such as electrons collect on the surface of the semiconductor substrate or in the exposed semiconductor devices. After several plasma processes, the accumulated charged particles may cause the performance of the semiconductor device to deteriorate, and even break the semiconductor device. Accordingly, monitoring wafers individual to the production wafers are used to detect the stability of the semiconductor process. For example, a CHARM-2 wafer is used to monitor the damage caused by the charged particles, and the electrically erasable programmable read only memory ($E^2PROM$) can be taken as a test structure in the CHARM-2 wafer. The complicated structure of the $E^2PROM$ increases the manufacturing cost of the CHARM-2 wafer, however. Additionally, the monitoring wafer may recognize the divergence of the semiconductor processes, but will fail to reflect the status of the production wafers. Consequently, how to simplify a test structure for detecting charged particles in order to decrease the cost of a monitoring wafer and achieve monitoring the production wafers is still an important issue in the field.

SUMMARY OF THE INVENTION

An objective of the present invention is therefore to provide a test structure having a simple structure and a monitoring method in order to decrease the cost of a monitoring wafer used for detecting charged particles in semiconductor processes.

According to one exemplary embodiment of the present invention, a test structure for a semiconductor process is provided. The test structure includes a semiconductor substrate, a first doped region, a second doped region, an insulating layer and a conductive layer. The first doped region and the second doped region are disposed in the semiconductor substrate, and the insulating layer is disposed on the semiconductor substrate. The conductive layer in a floating state is disposed directly on the insulating layer. The conductive layer partially overlaps the first doped region and partially overlaps the second doped region.

According to another exemplary embodiment of the present invention, a method of monitoring a semiconductor process includes the following steps. A semiconductor substrate is provided, and at least a test structure is formed. The method of forming the test structure includes the following steps. A first doped region and a second doped region are formed in the semiconductor substrate; subsequently, an insulating layer is formed on the semiconductor substrate, and a conductive layer is formed on the insulating layer, at which point the formation of the test structure is completed. The conductive layer in a floating state partially overlaps the first doped region and partially overlaps the second doped region. Then, a voltage signal is applied to the test structure, and a breakdown voltage (Vbd) between the first doped region and the second doped region is measured.

The present invention provides a test structure. A voltage signal is applied to the conductive layer of the test structure, and a breakdown voltage (Vbd) between the first doped region and the second doped region is measured to determine if a Vbd shift occurs, which indicates whether charged particles have accumulated on the surface of the semiconductor substrate during the semiconductor process or not. The steps of forming the test structure are simple, and the manufacturing process of the test structure can be integrated into the semiconductor processes of the production wafer. Accordingly, the cost of the formation of the test structure is low with respect to the prior art and monitoring each of the production wafers can be achieved. In addition, the repetitive deposition of the test structure can enhance the detection signal and facilitate observations of the plot about the I-V curve (electric current versus the electric voltage) between the first doped region and the second doped region.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
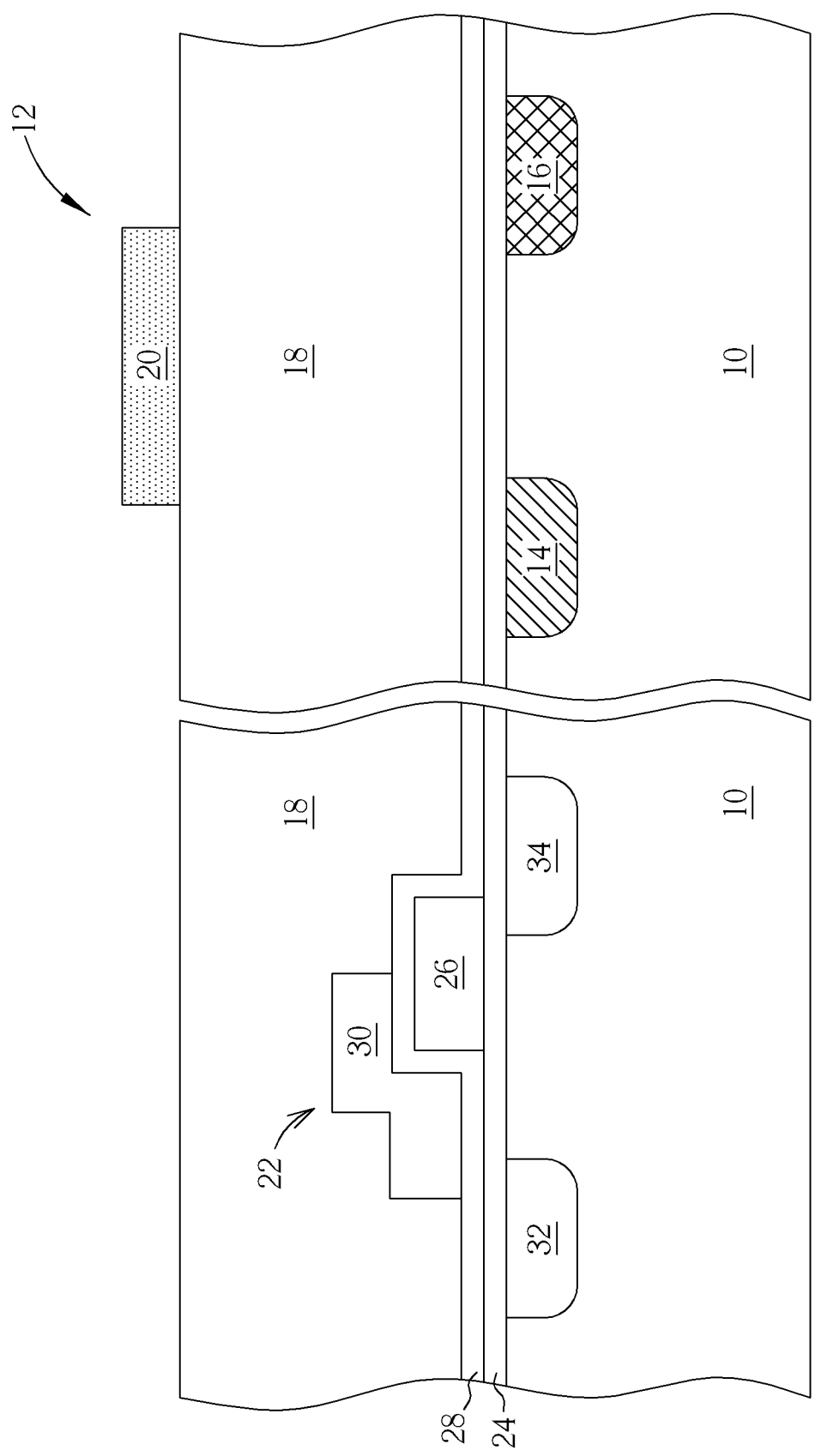
FIG. 1 is a schematic diagram illustrating a test structure for a semiconductor process according to a preferred exemplary embodiment of the present invention.

Please refer to FIG. 1, which is a schematic diagram illustrating a test structure for a semiconductor process according to a preferred exemplary embodiment of the present invention. As shown in FIG. 1, the semiconductor substrate 10 includes at least a test structure 12 where, for example, the test structure 12 could be disposed in a scribe line in a test region. The semiconductor substrate 10 may further include at least a semiconductor device 22 where, for example, the semiconductor device 22 could be disposed in a circuit region of a die. The semiconductor substrate 10 may be a substrate composed of gallium arsenide (GaAs), silicon on insulator (SOI) layer, epitaxial layer, SiGe layer or other semiconductor materials.

The test structure 12 includes the semiconductor substrate 10, a first doped region 14, a second doped region 16, an insulating layer 18 and a conductive layer 20. The first doped region 14 and the second doped region 16 are disposed in the semiconductor substrate 10, and the first doped region 14 does not overlap the second doped region 16. The semiconductor substrate 10 has a first conductivity type, the first doped region 14 has a second conductivity type and the second doped region 16 has the second conductivity type. The first conductivity type could be n-type or p-type, and the second conductivity type could be the other. The insulating layer 18 disposed on the semiconductor substrate 10 may directly contact the semiconductor substrate 10 between the first doped region 14 and the second doped region 16, and totally cover the semiconductor device 22, the first doped region 14 and the second doped region 16. The insulating layer 18 is made of insulating materials such as spin-on glass (SOG), phosphosilicate glass (PSG), borophosphosilicate glass (BPSG), or fluorosilicate glass (FSG). In this exemplary embodiment, the insulating layer 18 could be an inter-layer dielectric (ILD) layer having a thickness substantially around 3500 angstroms. The conductive layer 20 of the test structure 12 is disposed directly on the insulating layer 18 and is laterally spaced apart from the semiconductor device 22. The conductive layer 20 partially overlaps the first doped region 14, partially overlaps the second doped region 16, and overlaps the semiconductor substrate 10 between the first doped region 14 and the second doped region 16. The first doped region 14, the second doped region 16 and the conductive layer 20 are in a floating state. It should be appreciated that the conductive layer 20 could be a metal layer used to accept the voltage signal applied to the test structure 12 for further neutralizing the charged particles on the surface of the semiconductor substrate 10.

The semiconductor device 22 disposed in the circuit region of the die may be an electrically erasable programmable read only memory ($E^2$PROM), where the gate structure of the semiconductor device 22 includes a floating gate dielectric layer 24, a floating gate electrode 26, a silicon oxide layer 28, a control gate electrode 30 and two doped regions 32/34. The floating gate dielectric layer 24 is disposed under the floating gate electrode 26; the control gate electrode 30 is disposed on the floating gate electrode 26; the silicon oxide layer 28 disposed between the floating gate electrode 26 and the control gate electrode 30 may serve as a tunnel oxide layer; and the two doped regions 32/34 are disposed respectively in the semiconductor substrate 10 at the two sides of the floating gate electrode 26 and the control gate electrode 30. The floating gate dielectric layer 24 could be made of an insulating material such as silicon oxide, and the floating gate electrode 26 and the control gate electrode 30 could be made of conductive material such as polysilicon or metal silicide.

The insulating layer 18 of the test structure 12 could totally cover the semiconductor device 22; in other words, the thickness of the insulating layer 18 is substantially larger than a thickness of the floating gate dielectric layer 24, a thickness of the silicon oxide layer 28, or a sum of the thickness of the floating gate dielectric layer 24 and the thickness of the silicon oxide layer 28. Additionally, in the test region, the gate electrode made of conductive material is not disposed on the semiconductor substrate 10 overlapped by the conductive layer 20 of the test structure 12. The distance between the two doped regions 32/34 of the semiconductor device 22 may be affected by the size of the floating gate electrode 26 and the size of the control gate electrode 30. The distance between the first doped region 14 and the second doped region 16 can be adjusted according to the design demand without restricting the formed structures on the semiconductor substrate 10; i.e. the alignment of the location of the first doped region 14 and the second doped region 16 does not rely on the formed structures, which reduces the restriction of manufacturing processes. Accordingly, in the present invention, the test structure 12 could be formed along with the semiconductor processes of the die of the production wafer, so that the test structure 12 may directly and effectively monitor the accumulated charged particles caused by the semiconductor processes performed on the production wafer. The utilization of the test structure 12 having an uncomplicated structure could simplify the manufacturing process of the test structure 12, reduce errors caused during the manufacturing process and decrease the cost, while also achieving monitoring for the charged particles.

Figure 2:
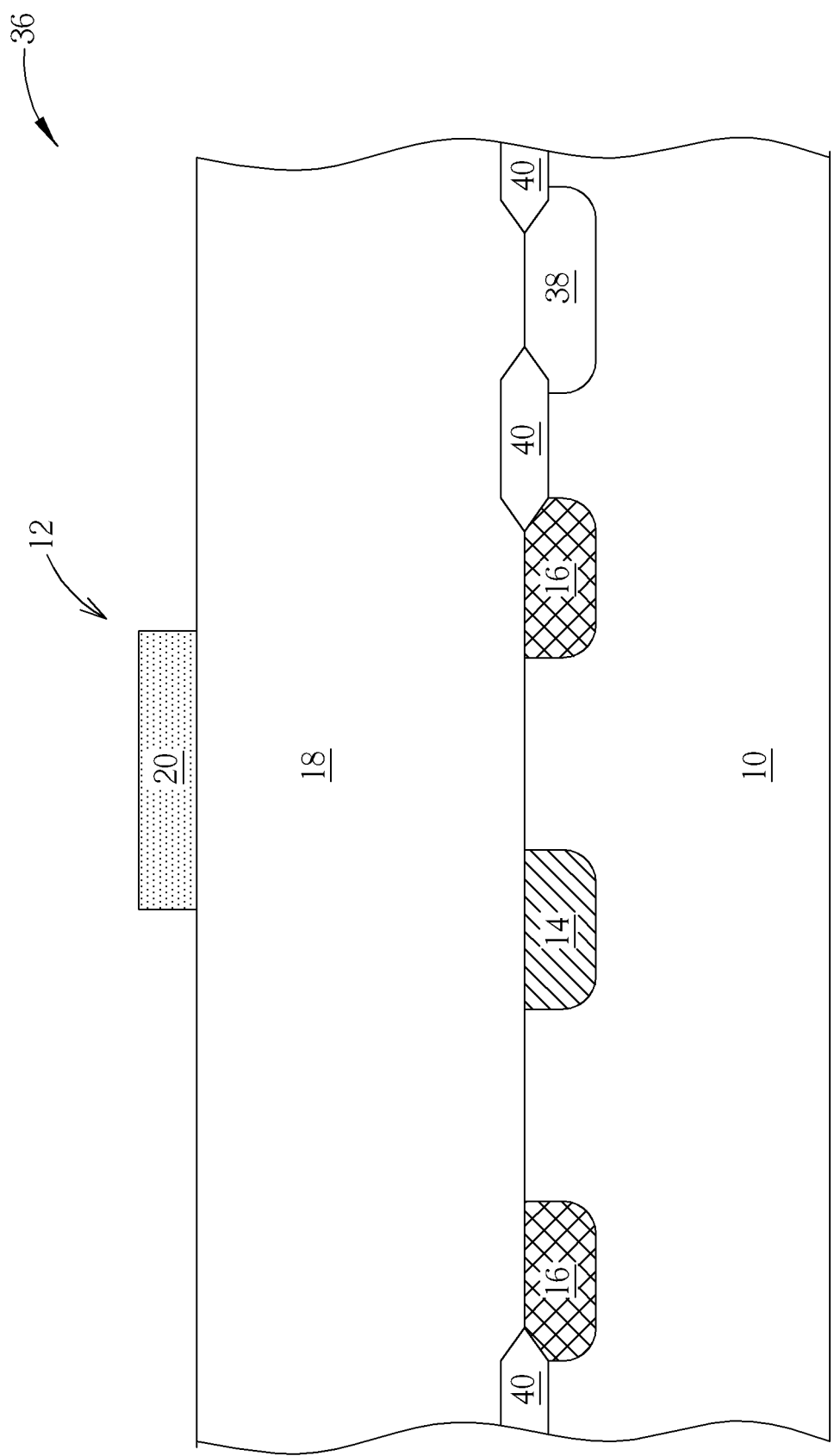
FIG. 2 is a schematic diagram illustrating a test structure for a semiconductor process according to another preferred exemplary embodiment of the present invention.

The first doped region 14 and the second doped region 16 of the test structure 12 could be formed through a respective ion implantation process, or be integrated into the other semiconductor processes performed on the semiconductor substrate 10. For example, the test structure 12 may be integrated into the structure of bipolar junction transistor (BJT). Please refer to FIG. 2, which is a schematic diagram illustrating a test structure for a semiconductor process according to another preferred exemplary embodiment of the present invention. As shown in FIG. 2, the emitter and the collector of the BJT 36 can respectively serve as the first doped region 14 and the second doped region 16 of the test structure 12, and the collector surrounds the emitter, i.e. the second doped region 16 surrounds the first doped region 14. Additionally, the BJT 36 further includes a third doped region 38 as the base. In this exemplary embodiment, the semiconductor substrate 10 has the first conductivity type, the first doped region 14 and the second doped region 16 have the second conductivity type, and the third doped region 38 has the first conductivity type, but not limited thereto. Furthermore, an insulating layer 40 is disposed in the semiconductor substrate 10 between the second doped region 16 and the third doped region 38 for electrically insulating the second doped region 16 from the third doped region 38.

Figure 3:
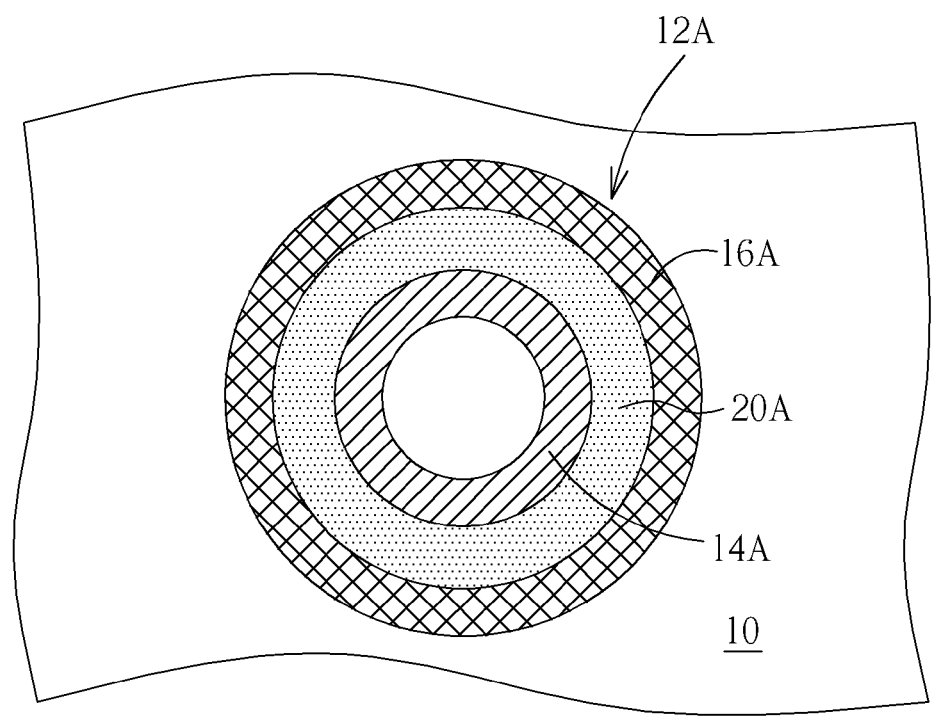
FIG. 3 is a top view illustrating a test structure for a semiconductor process according to a preferred exemplary embodiment of the present invention.

For obtaining correct measurement results such as the analyzable detection signal, the size, the configuration and the layout of the first doped region 14, the second doped region 16 and the conductive layer 20 can be adjusted. Please refer to FIG. 3, FIG. 4 and FIG. 5. FIG. 3 is a top view illustrating a test structure for a semiconductor process according to a preferred exemplary embodiment of the present invention. As shown in FIG. 3, the test structure 12A includes the semiconductor substrate 10, a first doped region 14A, a second doped region 16A not overlapped by the first doped region 14A, an insulating layer (not shown) on the first doped region 14A and the second doped region 16A, and a conductive layer 20A on the insulating layer. The first doped region 14A, the second doped region 16A and the conductive layer 20A respectively include a ring shaped structure. The circular conductive layer 20A is disposed between the circular first doped region 14A and the circular second doped region 16A. In this exemplary embodiment, the conductive layer 20A may completely overlap the semiconductor substrate 10 between the first doped region 14A and the second doped region 16A. For further enhancing the detection signal, enlargement of the distance between the first doped region 14A and the second doped region 16A, or repetitive disposition of the test structure 12A, can increase the area where the conductive layer 20A overlaps the semiconductor substrate 10 between the first doped region 14A and the second doped region 16A.

Figure 4:
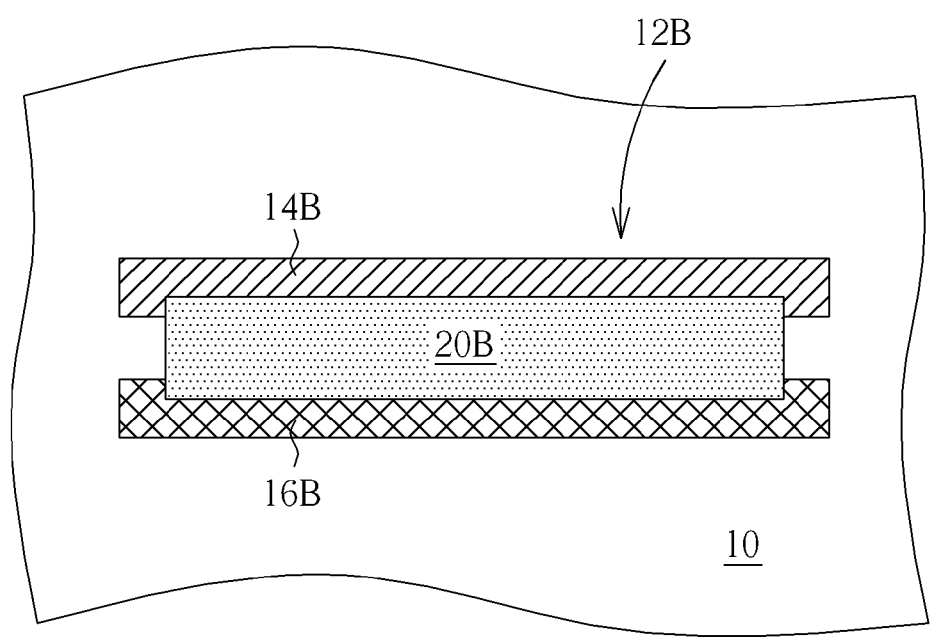
FIG. 4 is a top view illustrating a test structure for a semiconductor process according to another preferred exemplary embodiment of the present invention.
Figure 5:
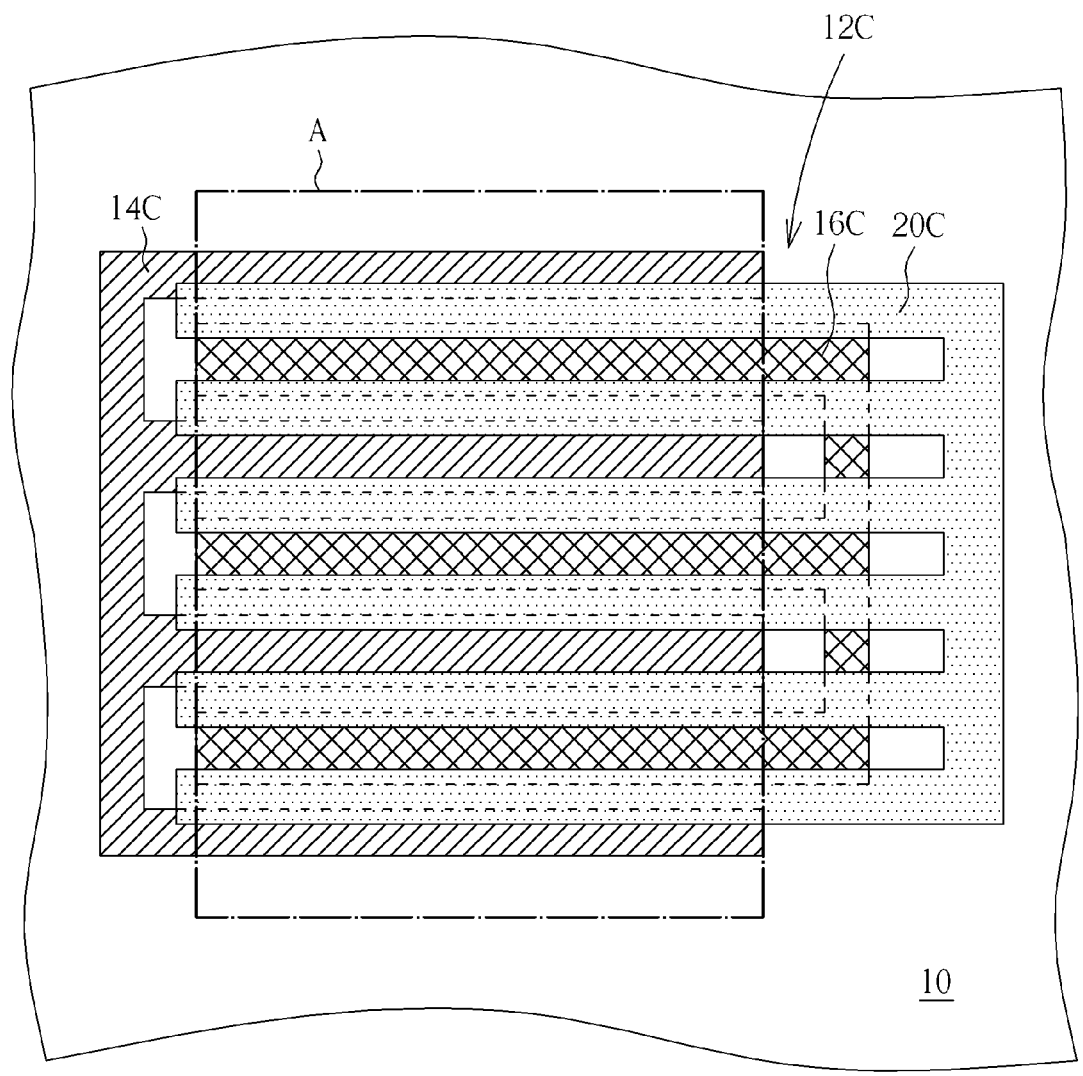
FIG. 5 is a top view illustrating a test structure for a semiconductor process according to the other preferred exemplary embodiment of the present invention.

FIG. 4 is a top view illustrating a test structure for a semiconductor process according to another preferred exemplary embodiment of the present invention. As shown in FIG. 4, the test structure 12B includes the semiconductor substrate 10, a first doped region 14B having a finger shaped structure, a second doped region 16B parallel to the first doped region 14B, an insulating layer (not shown) and a conductive layer 20B having a finger shaped structure. The first doped region 14B and the second doped region 16B may be disposed on the same surface, for example, in the semiconductor substrate 10. The insulating layer is disposed among the first doped region 14B, the second doped region 16B, the semiconductor substrate 10 and the conductive layer 20B. The conductive layer 20B is directly disposed on the insulating layer. FIG. 5 is a top view illustrating a test structure for a semiconductor process according to the other preferred exemplary embodiment of the present invention. As shown in FIG. 5, on the semiconductor substrate 10 in the test region A, for example, on a scribe line, the test structure 12C includes a plurality of the test structure 12B as illustrated above to enhance the detection signal. The first doped region 14C, the second doped region 16C and the conductive layer 20C all include at least a finger shaped structure. Analogically, the first doped region 14C does not overlap the second doped region 16C, the conductive layer 20B is directly disposed on the semiconductor substrate 10 between the first doped region 14C and the second doped region 16C, and the finger shaped structures are in an interlaced disposition, i.e. a finger shaped structure of the conductive layer 20C is between a finger shaped structure of the first doped region 14C and a finger shaped structure of the second doped region 16C from the top view. The conductive layer 20C partially overlaps the first doped region 14C, partially overlaps the second doped region 16C, and overlaps the semiconductor substrate 10 between the first doped region 14C and the second doped region 16C.

The layout of the first doped region 14, the second doped region 16 and the conductive layer 20 could be any geometrical pattern or non-geometrical pattern, and the configuration of the conductive layer 20 is not limited to a ring shaped structure or a finger shaped structure. In addition, in other exemplary embodiments, the conductive layer could overlap the semiconductor substrate between the first doped region and the second doped region, while the conductive layer does not overlap the first doped region and the second doped region.

Figure 6:
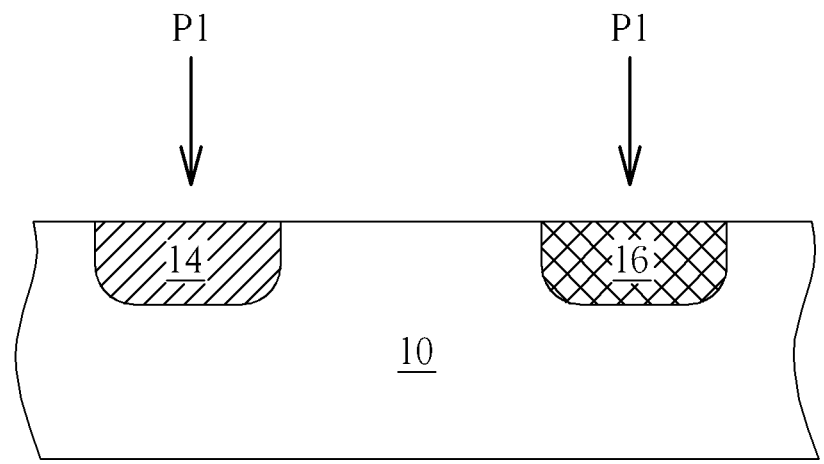
FIG. 6, FIG. 7 and FIG. 8 are schematic diagrams illustrating a method of fabricating a test structure according to a preferred exemplary embodiment of the present invention.
Figure 7:
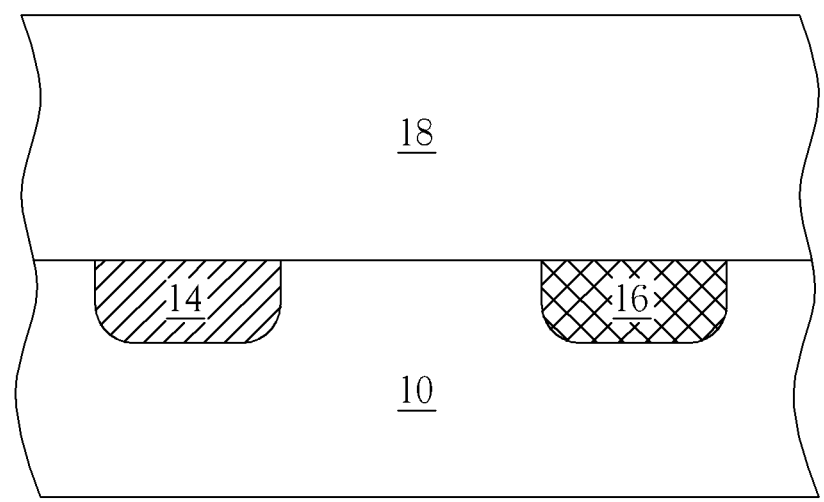
Figure 8:
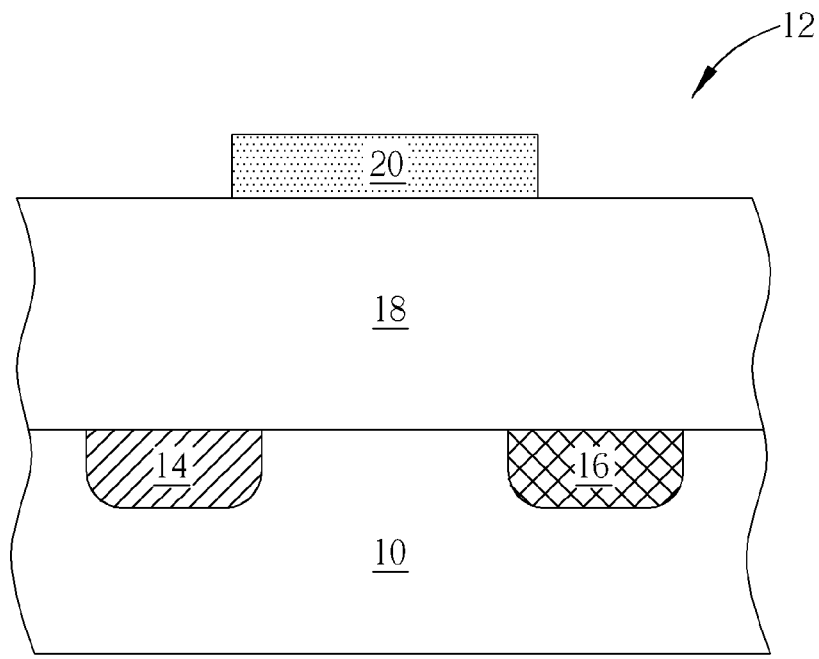

The present invention also provides a method of forming the test structure. To simplify the explanation, the same components are referred to using the same numerals as before in the following exemplary embodiments, and only the differences are discussed while the similarities are not mentioned again. Please refer to FIG. 6 through FIG. 8. FIG. 6, FIG. 7 and FIG. 8 are schematic diagrams illustrating a method of fabricating a test structure according to a preferred exemplary embodiment of the present invention. As shown in FIG. 5, ion implantation process P1 is performed to form the first doped region 14 and the second doped region 16 in the semiconductor substrate 10 respectively, and both the first doped region 14 and the second doped region 16 are in the floating state. The semiconductor substrate 10 has the first conductivity type, and the first doped region 14 and the second doped region 16 have the second conductivity type. The first conductivity type could be n-type or p-type, and the second conductivity type could be the other. The present invention is also applicable when the semiconductor substrate, the first doped region and the second doped region all have the second conductivity type. The method used to make the semiconductor substrate between the first doped region and the second doped region have the first conductivity type includes performing an ion implantation process to form a well having the first conductivity type, where the well surrounds the first doped region and the second doped region; or performing a selective epitaxial growth (SEG) process to form epitaxial layer (not shown) having the first conductivity type on the semiconductor substrate 10, after which the first doped region 14 and the second doped region 16 having the second conductivity type will be formed in the epitaxial layer. Additionally, the ion implantation process P1 may be integrated into the semiconductor process performed in the circuit region of a die; for example, the ion implantation process used to form the source/drain region in the semiconductor device in the die of the production wafer.

Subsequently, as shown in FIG. 7, after the completion of the semiconductor processes of the semiconductor device in the circuit region of the die, for example, after the gate electrode process is performed, the following processes will take place. Plasma enhanced chemical vapor deposition (PECVD) process, atmospheric pressure chemical vapor deposition (APCVD) process, or sub-atmospheric pressure chemical vapor deposition (SACVD) process is performed to form the insulating layer 18 on the semiconductor substrate 10. The material of the insulating layer 18 could be insulating materials such as spin-on glass (SOG), phosphosilicate glass (PSG), borophosphosilicate glass (BPSG), or fluorosilicate glass (FSG). In this exemplary embodiment, the insulating layer 18 may be the BPSG layer fabricated through the PECVD process, where a thickness of the insulating layer 18 is substantially around 3500 angstroms. It should be noted that the improper composition rate of the boron ion or the phosphorous ion, or the unsuitable process temperature may cause the charged particles to diffuse from the insulating layer 18 to the semiconductor substrate 10, causing charged particles to accumulate on the surface of the semiconductor substrate 10, which adversely affects the performance of the other semiconductor devices disposed in the semiconductor substrate 10.

As shown in FIG. 8, a sputter process is performed to form a conductive layer 20 on the insulating layer 18. The conductive layer 20 including a metal layer can be used to accept a voltage signal for further neutralizing the charged particles on the surface of the semiconductor substrate 10 underneath the conductive layer 20. The conductive layer 20 in a floating state partially overlaps the first doped region 14 and partially overlaps the second doped region 16. It is preferable that the conductive layer 20 can totally overlap the semiconductor substrate 10 between the first doped region 14 and the second doped region 16, but the invention is not limited thereto. Accordingly, the process for forming a test structure 12 is completed. The layout of the first doped region, the second doped region 16 and the conductive layer 20 is not limited to the illustrated embodiments; it could be a geometrical pattern or a non-geometrical pattern.

Figure 9:
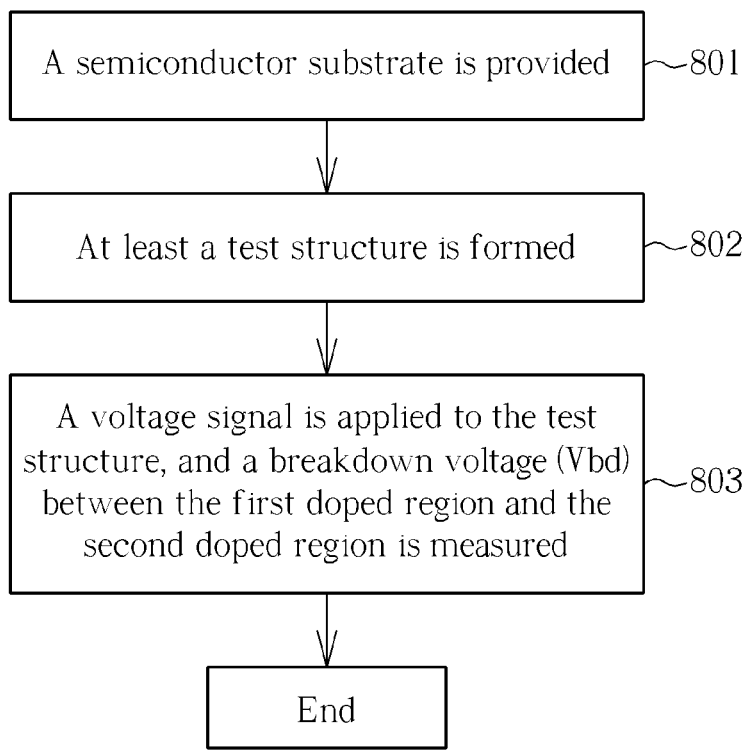
FIG. 9 is a flow chart illustrating a method for monitoring a semiconductor process according to a preferred exemplary embodiment of the present invention.

In the following paragraph, a method of monitoring a semiconductor process particularly directed to detecting accumulated charged particles on the surface of the semiconductor substrate in the use of the illustrated test structure will be explained. Please refer to FIG. 9, and refer to FIG. 6, FIG. 7 and FIG. 8 together. FIG. 9 is a flow chart illustrating a method for monitoring a semiconductor process according to a preferred exemplary embodiment of the present invention. As shown in step 801, a semiconductor substrate 10 is provided. In step 802, at least a test structure 12 is formed, where the test structure 12 includes the semiconductor substrate 10, the first doped region 14, the second doped region 16, the insulating layer 18 and the conductive layer 20. During the formation of the insulating layer 18 or other semiconductor processes, some charged particles may accumulate on the surface of the semiconductor substrate 10. Accordingly, as shown in step 803, a voltage signal is applied to the test structure 12, and the breakdown voltage (Vbd) between the first doped region 14 and the second doped region 16 is measured. The voltage signal applied to the conductive layer 20 of the test structure 12 can induce the coupling charged particles to neutralize the charged particles on the surface of the semiconductor substrate 10. Additionally, probes are respectively and electrically connected to the first doped region 14 and the second doped region 16 to measure the electric current and the electric voltage between the first doped region 14 and the second doped region 16 and plot I-V curve (the electric current versus the electric voltage), and the breakdown voltage between the first doped region 14 and the second doped region 16 can be further determined by the I-V curve.

Figure 10:
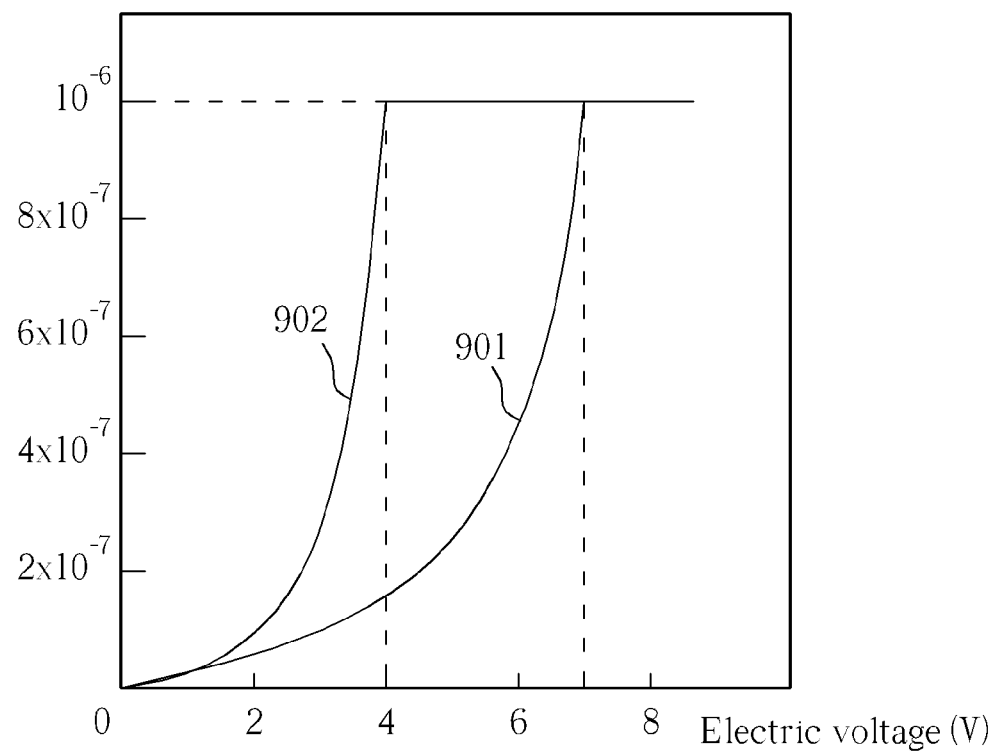
FIG. 10 is a plot of electric current versus electric voltage illustrating a method for monitoring a semiconductor process according to a preferred exemplary embodiment of the present invention.

Please refer to FIG. 10, which is a plot of electric current versus electric voltage illustrating a method for monitoring a semiconductor process according to a preferred exemplary embodiment of the present invention. As shown in FIG. 10, when the conductive layer is still in a floating state, the curve 901 represents the I-V curve (the relation of the electric current versus the electric voltage) between the first doped region and the second doped region under the condition where no charged particle accumulates on the surface of the semiconductor substrate; and the curve 902 represents the I-V curve (the relation of the electric current versus the electric voltage) between the first doped region and the second doped region under the condition where charged particles accumulate on the surface of the semiconductor substrate. The test curve 902 has a shift compared to the standard curve 901. For example, if the charge of the charged particles is positive and a positive voltage signal is applied to the conductive layer, the positive voltage signal may induce the coupling charged particles having negative charge to neutralize the charged particles. With the increase of the positive voltage signal, the measured I-V curve will shift towards or overlap the curve 901; that is, the difference of the breakdown voltage between the test curve and the standard curve is reduced. In this case, the first doped region and the second doped region preferably have the p-type conductivity type, and the semiconductor substrate between the first doped region and the second doped region preferably has the n-type conductivity type. Analogically, if the charge of the charged particles is negative and a negative voltage signal is applied to the conductive layer, the negative voltage signal may induce the coupling charged particles having positive charge to neutralize the charged particles. With the increase of the negative voltage signal, the measured I-V curve will shift towards or overlap the curve 901; that is, the difference of the breakdown voltage between the test curve and the standard curve is reduced. In this case, the first doped region and the second doped region preferably have the n-type conductivity type, and the semiconductor substrate between the first doped region and the second doped region preferably has the p-type conductivity type.

In conclusion, the present invention provides a test structure. A voltage signal is applied to the conductive layer of the test structure, and a breakdown voltage (Vbd) between the first doped region and the second doped region is measured to determine whether charged particles accumulate on the surface of the semiconductor substrate during the semiconductor process. The steps of forming the test structure are simple, and the manufacturing process of the test structure can be integrated into the semiconductor processes of the production wafer. Accordingly, the cost of forming the test structure may be decreased with respect to the prior art, and monitoring each of the production wafers can be achieved. In addition, the repetitive deposition of the test structure can enhance the detection signal and facilitate the observation of the plot about the I-V curve (electric current versus the electric voltage) between the first doped region and the second doped region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test structure for a semiconductor process, comprising:
    a semiconductor substrate with a gate structure;
    a first doped region disposed in the semiconductor substrate;
    a second doped region disposed in the semiconductor substrate;
    an inter-layer dielectric (ILD) layer disposed on the semiconductor substrate,
        wherein the ILD layer covers the gate structure; and
    a conductive layer disposed directly on the ILD layer,
        wherein the conductive layer partially overlaps the first doped region and partially overlaps the second doped region, the conductive layer is laterally spaced apart from the gate structure and is in a floating state, the conductive layer overlaps the semiconductor substrate between the first doped region and the second doped region, and only the semiconductor substrate is disposed between the first doped region and the second doped region.

2. The test structure according to claim 1, wherein the first doped region does not overlap the second doped region.

3. The test structure according to claim 2, wherein the ILD layer directly contacts the semiconductor substrate between the first doped region and the second doped region, and covers the first doped region and the second doped region.

4. The test structure according to claim 3, wherein a thickness of the ILD layer is substantially around 3500 angstroms.

5. The test structure according to claim 1, wherein the conductive layer comprises a metal layer.

6. The test structure according to claim 1, wherein the conductive layer comprises a finger shaped structure or a ring shaped structure.

7. The test structure according to claim 1, wherein the semiconductor substrate has a first conductivity type, the first doped region has a second conductivity type and the second doped region has the second conductivity type.

8. The test structure according to claim 7, wherein the first conductivity type comprises n-type or p-type, and the second conductivity type comprises the other.

9. A method of monitoring a semiconductor process, comprising:
providing a semiconductor substrate with a gate structure;
forming at least a test structure, comprising:
forming a first doped region in the semiconductor substrate;
forming a second doped region in the semiconductor substrate;
forming an inter-layer dielectric (ILD) layer on the semiconductor substrate, wherein the ILD layer covers the gate structure; and
directly forming a conductive layer on the ILD layer, wherein the conductive layer partially overlaps the first doped region and partially overlaps the second doped region, the conductive layer is laterally spaced apart from the gate structure and is in a floating state, the conductive layer overlaps the semiconductor substrate between the first doped region and the second doped region, and only the semiconductor substrate is disposed between the first doped region and the second doped region;
applying a voltage signal to the test structure; and
measuring a breakdown voltage (Vbd) between the first doped region and the second doped region.

10. The method of monitoring a semiconductor process according to claim 9, wherein the first doped region does not overlap the second doped region.

11. The method of monitoring a semiconductor process according to claim 9, wherein the ILD layer directly contacts the semiconductor substrate between the first doped region and the second doped region, and overlaps the first doped region and the second doped region.

12. The method of monitoring a semiconductor process according to claim 9, wherein the conductive layer comprises a metal layer.

13. The method of monitoring a semiconductor process according to claim 9, wherein the conductive layer comprises a finger shaped structure or a ring shaped structure.

14. The method of monitoring a semiconductor process according to claim 9, wherein the semiconductor substrate has a first conductivity type, the first doped region has a second conductivity type and the second doped region has the second conductivity type.

15. The method of monitoring a semiconductor process according to claim 14, wherein the first conductivity type comprises n-type or p-type, and the second conductivity type comprises the other.

16. The method of monitoring a semiconductor process according to claim 9, wherein the step of measuring the breakdown voltage comprises measuring an electric current and an electric voltage between the first doped region and the second doped region to plot an I-V curve.

17. The method of monitoring a semiconductor process according to claim 9, wherein the breakdown voltage corresponds to charged particles on the surface of the semiconductor substrate.

* * * * *